(12) United States Patent
Okada

(10) Patent No.: US 10,862,452 B2
(45) Date of Patent: Dec. 8, 2020

(54) ELASTIC WAVE FILTER DEVICE

(71) Applicant: Murata Manufacturing Co., Ltd., Nagaokakyo (JP)

(72) Inventor: Shinichi Okada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 35 days.

(21) Appl. No.: 16/232,108

(22) Filed: Dec. 26, 2018

(65) Prior Publication Data

US 2019/0131954 A1 May 2, 2019

Related U.S. Application Data

(63) Continuation of application No. PCT/JP2017/018703, filed on May 18, 2017.

(30) Foreign Application Priority Data

Jun. 27, 2016 (JP) .................. 2016-126824

(51) Int. Cl.
*H03H 9/64* (2006.01)
*H03H 9/72* (2006.01)
(Continued)

(52) U.S. Cl.
CPC ...... *H03H 9/1457* (2013.01); *H03H 9/02637* (2013.01); *H03H 9/02992* (2013.01);
(Continued)

(58) Field of Classification Search
CPC .................. H03H 9/64; H03H 9/76
See application file for complete search history.

(56) References Cited

U.S. PATENT DOCUMENTS 9,673,779 B2 * 6/2017 Ruile .................. H03H 3/08
10,009,009 B2 * 6/2018 Mimura ............. H03H 9/02992
(Continued)

FOREIGN PATENT DOCUMENTS

JP   2000-183681 A   6/2000
JP   2012-186808 A   9/2012
(Continued)

OTHER PUBLICATIONS

Official Communication issued in International Patent Application No. PCT/JP2017/018703, dated Jul. 25, 2017.

*Primary Examiner* — Dean O Takaoka
*Assistant Examiner* — Alan Wong
(74) *Attorney, Agent, or Firm* — Keating & Bennett, LLP

(57) ABSTRACT

An elastic wave filter device includes a ladder filter that includes series arm resonators and parallel arm resonators. In one series arm resonator in which the acoustic velocity in a first and second edge area is lower than in a central area, each first electrode finger includes a large-width portion having a width larger than in remaining portions in the second edge area, and each second electrode finger includes a large-width portion having a width larger than in remaining portions in the first edge area. In at least one of remaining series arm resonators and the parallel arm resonators, each first and second electrode finger includes a large-width portion having a width larger than in remaining portions in both of the first and second edge areas.

16 Claims, 12 Drawing Sheets

(51) Int. Cl.
    *H03H 9/145*     (2006.01)
    *H03H 9/02*     (2006.01)
    *H03H 9/25*     (2006.01)

(52) U.S. Cl.
    CPC .............. *H03H 9/145* (2013.01); *H03H 9/25* (2013.01); *H03H 9/64* (2013.01); *H03H 9/6483* (2013.01); *H03H 9/6496* (2013.01); *H03H 9/725* (2013.01)

(56) References Cited

U.S. PATENT DOCUMENTS

| | | |
|---|---|---|
| 10,382,008 B2 * | 8/2019 | Kim .................... H03H 9/02992 |
| 10,461,718 B2 * | 10/2019 | Nakazawa ............... H03H 9/64 |
| 2011/0068655 A1 | 3/2011 | Solal et al. |
| 2013/0051588 A1 | 2/2013 | Ruile et al. |
| 2016/0072475 A1 | 3/2016 | Mimura et al. |
| 2017/0093367 A1 | 3/2017 | Mimura |

FOREIGN PATENT DOCUMENTS

| | | |
|---|---|---|
| JP | 2013-518455 A | 5/2013 |
| JP | 2014-131351 A | 7/2014 |
| WO | 2014/192756 A1 | 12/2014 |
| WO | 2015/198897 A1 | 12/2015 |

\* cited by examiner

ELASTIC WAVE FILTER DEVICE

CROSS REFERENCE TO RELATED APPLICATIONS

This application claims the benefit of priority to Japanese Patent Application No. 2016-126824 filed on Jun. 27, 2016 and is a Continuation Application of PCT Application No. PCT/JP2017/018703 filed on May 18, 2017. The entire contents of each application are hereby incorporated herein by reference.

BACKGROUND OF THE INVENTION

1. Field of the Invention

The present invention relates to an elastic wave filter device using a surface acoustic wave or a boundary acoustic wave, and specifically, to an elastic wave filter device using a piston mode.

2. Description of the Related Art

Various types of elastic wave filters using a piston mode have been proposed recently. For example, Japanese Unexamined Patent Application Publication No. 2014-131351 describes an electrode finger intersection area in which an edge area where the acoustic velocity is relatively low is provided on each side of a central area. The width of each electrode finger in the edge area is larger than that of the remaining portion. Such a large-width portion is provided to form a piston mode, thus reducing or preventing a ripple due to transverse modes.

Meanwhile, elastic wave filter devices are required to achieve both increased steepness in the filter characteristics and lower loss in the passband and, for example, a method for adjusting the film thickness of interdigital transducer (IDT) electrodes or a method for adjusting the bandwidth ratio of elastic wave resonators using a bridge capacitance are being studied. However, these methods have difficulty in controlling the film thickness of IDT electrodes or the bandwidth ratio of elastic wave resonators with high accuracy while achieving both increased steepness and lower loss in the passband.

SUMMARY OF THE INVENTION

Preferred embodiments of the present invention provide elastic wave filter devices with which a transverse-mode ripple is able to be reduced or prevented, and both increased steepness in the filter characteristics and lower loss in the passband are able to be achieved with certainty.

An elastic wave filter device according to a preferred embodiment of the present invention of the present application includes a ladder filter that includes a series arm resonator and a parallel arm resonator defined by elastic wave resonators, each of the elastic wave resonators including a piezoelectric body, a first busbar and a second busbar that face each other, a plurality of first electrode fingers each including a base end connected to the first busbar and a leading end located on a side thereof closer to the second busbar, and a plurality of second electrode fingers each including a base end connected to the second busbar and a leading end located on a side thereof closer to the first busbar, the first busbar, the second busbar, the plurality of first electrode fingers, and the plurality of second electrode fingers being provided on the piezoelectric body, the plurality of first electrode fingers and the plurality of second electrode fingers being interposed with one another. The first electrode fingers and the second electrode fingers overlap in an elastic wave propagation direction in an intersection area, the intersection area includes a central area located centrally in a direction in which the first electrode fingers and the second electrode fingers extend, a first edge area located on a side of the central area closer to the first busbar, and a second edge area located on a side of the central area closer to the second busbar, and an acoustic velocity in the first edge area and in the second edge area is lower than an acoustic velocity in the central area. In at least one series arm resonator among the series arm resonators, each of the first electrode fingers includes a large-width portion having a width larger than a width of a remaining portion in the second edge area, and each of the second electrode fingers includes a large-width portion having a width larger than a width of a remaining portion in the first edge area. In at least one of the remaining series arm resonator(s) and the parallel arm resonators, each of the first electrode fingers includes a large-width portion having a width larger than a width of a remaining portion in both of the first edge area and the second edge area, and each of the second electrode fingers includes a large-width portion having a width larger than a width of a remaining portion in both of the first edge area and the second edge area.

Preferably, in the at least one series arm resonator, when a length of the first edge area and the second edge area in the direction in which the first electrode fingers and the second electrode fingers extend is represented by Apt1, and a length of the central area in the direction in which the first electrode fingers and the second electrode fingers extend is represented by Apt2, Apt1/Apt2 is about 0.0638 or more and about 0.094047 or less. In this case, the bandwidth ratio in the at least one series arm resonator is able to be further reduced. Therefore, steepness in the filter characteristics in a high-frequency range in the passband is able to be further increased.

An elastic wave filter device according to a preferred embodiment of the present invention of the present application includes a ladder filter that includes series arm resonators and parallel arm resonators defined by elastic wave resonators, each of the elastic wave resonators including a piezoelectric body, a first busbar and a second busbar facing each other, a plurality of first electrode fingers each including a base end connected to the first busbar and a leading end located on a side thereof closer to the second busbar, and a plurality of second electrode fingers each including a base end connected to the second busbar and a leading end located on a side thereof closer to the first busbar, the first busbar, the second busbar, the plurality of first electrode fingers, and the plurality of second electrode fingers being provided on the piezoelectric body, the plurality of first electrode fingers and the plurality of second electrode fingers being interposed with one another. The first electrode fingers and the second electrode fingers overlap in an elastic wave propagation direction in an intersection area, the intersection area includes a central area located centrally in a direction in which the first electrode fingers and the second electrode fingers extend, a first edge area located on a side of the central area closer to the first busbar, and a second edge area located on a side of the central area closer to the second busbar, and an acoustic velocity in the first edge area and in the second edge area is lower than an acoustic velocity in the central area. In at least one series arm resonator among the series arm resonators, and in at least one of the series arm resonator(s) other than the at least one series arm resonator and the parallel arm resonators, each of the first electrode fingers includes a large-width portion having a width larger than a width of a remaining portion in both of the first edge area and the second edge area, and each of the second electrode fingers includes a large-width portion having a width larger than a width of a remaining portion in both of the first edge area and the second edge area. In the at least one series arm resonator, when a length of the first edge area and the second edge area in the direction in which the first electrode fingers and the second electrode fingers extend is represented by Apt3, and a length of the central area in the direction in which the first electrode fingers and the second electrode fingers extend is represented by Apt4, Apt3/Apt4 is about 0.083423 or more and about 0.10881 or less. In this case, in the other series arm resonator(s) and in the parallel arm resonators, transverse modes are able to be effectively reduced or prevented and the bandwidth ratio is able to be further reduced. Therefore, steepness in the filter characteristics is able to be further increased.

Preferably the at least one series arm resonator is a series arm resonator having a largest electrode finger pitch among the series arm resonators. In this case, the filter characteristics in a high-frequency range in the passband are able to be increased more effectively.

Preferably, the at least one series arm resonator is a series arm resonator having a lowest anti-resonant frequency among the series arm resonators. In this case, in the filter characteristics, steepness in a high-frequency range in the passband is able to be increased more effectively.

Preferably, the series arm resonators and the parallel arm resonators are provided on a single piezoelectric substrate. In this case, the elastic wave filter device is able to be provided as a one-chip component.

Preferably, when the ladder filter is a first bandpass filter having a first passband, the elastic wave filter device further includes a second bandpass filter having a second passband in a higher-frequency range than the first passband, the second bandpass filter and the first bandpass filter being commonly connected at one end thereof. In this case, an elastic wave filter device suitable for, for example, carrier aggregation (CA) is able to be provided.

Preferably, the first bandpass filter is a transmission filter and the second bandpass filter is a reception filter to define a duplexer.

With preferred embodiments of the present invention, both increased steepness in the filter characteristics and lower loss in the passband are able to be achieved with certainty while a transverse-mode ripple is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the accompanying drawings.

Note that preferred embodiments described herein are illustrative, and configurations in different preferred embodiments may be partially replaced or combined.

Figure 1:
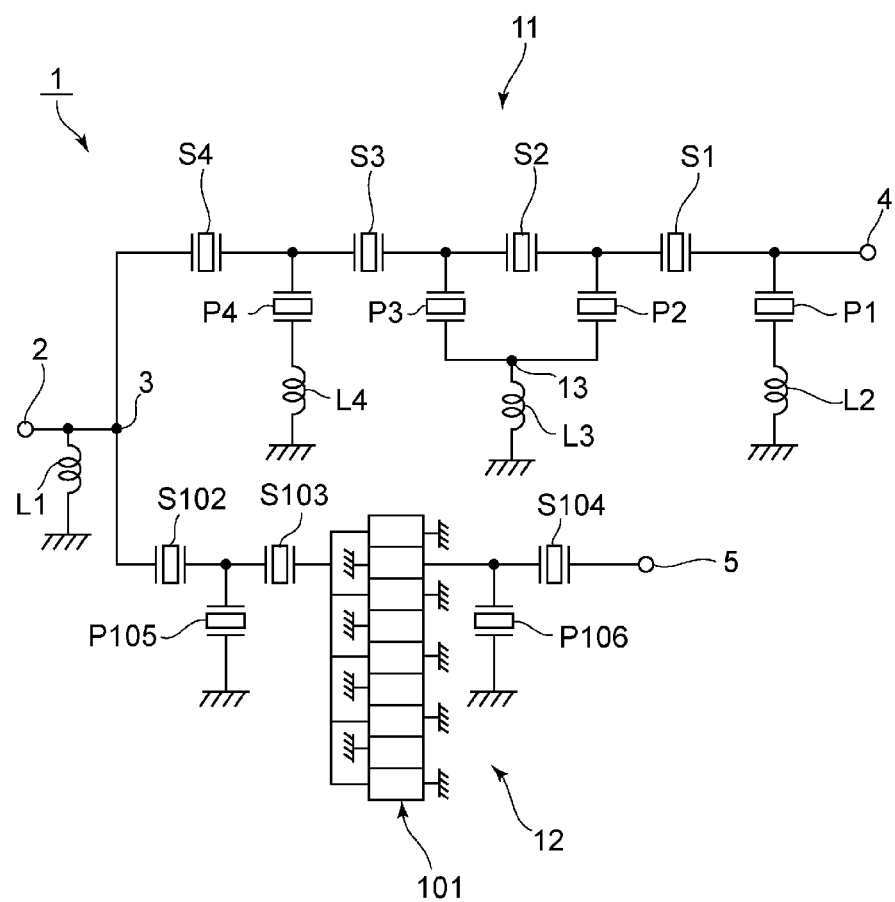
FIG. 1 is a circuit diagram of an elastic wave filter device according to a first preferred embodiment of the present invention.

FIG. 1 is a circuit diagram of an elastic wave filter device according to a first preferred embodiment of the present invention. An elastic wave filter device 1 is preferably a duplexer used in the RF stage of a mobile phone, for example. The elastic wave filter device 1 includes an antenna terminal 2 connected to an antenna. The antenna terminal 2 is connected to a common node 3. Between the common node 3 and a reference potential, an impedance adjusting inductor L1 is connected. Between the common node 3 and a transmission terminal 4, a transmission filter 11 is connected. Between the common node 3 and a reception terminal 5, a reception filter 12 is connected.

In the elastic wave filter device 1, the transmission filter 11 is preferably a ladder filter, for example.

Note that the passband of the reception filter 12 is in a higher-frequency range than the passband of the transmission filter 11.

The transmission filter 11 includes a plurality of series arm resonators S1, S2, S3, and S4 and a plurality of parallel arm resonators P1, P2, P3, and P4.

The series arm resonator S1, the series arm resonator S2, the series arm resonator S3, and the series arm resonator S4 are disposed in this order from a side closer to the transmission terminal 4, as illustrated in FIG. 1. The parallel arm resonator P1 is connected between the transmission terminal 4 and the reference potential. The parallel arm resonator P2 is connected between a node between the series arm resonator S1 and the series arm resonator S2 and a common node 13. Between the parallel arm resonator P1 and the reference potential, an inductor L2 is connected.

The parallel arm resonator P3 is connected between a node between the series arm resonator S2 and the series arm resonator S3 and the common node 13. Between the common node 13 and a ground potential, an inductor L3 is connected.

The parallel arm resonator P4 is connected between a node between the series arm resonator S3 and the series arm resonator S4 and the reference potential. Between the parallel arm resonator P4 and the reference potential, an inductor L4 is connected.

The reception filter 12 is not specifically limited. In the present preferred embodiment, the reception filter 12 includes a longitudinally coupled resonator elastic wave filter 101, series arm resonators S102, S103, and S104, and parallel arm resonators P105 and P106.

In the transmission filter 11, the series arm resonators S1 to S4 and the parallel arm resonators P1 to P4 are each preferably defined by an elastic wave resonator. In the transmission filter 11, first and second edge areas are provided in an intersection area to reduce or prevent a transverse-mode ripple. The structure as described in Japanese Unexamined Patent Application Publication No. 2014-131351 is known in which an edge area is provided on each side of a central area in an intersection area to reduce or prevent a transverse-mode ripple. In, for example, a ladder filter that includes a plurality of series arm resonators, similar edge areas are provided in every series arm resonator.

Meanwhile, in the transmission filter 11, the series arm resonator S1, which is closest to the transmission terminal 4 among the plurality of series arm resonators S1 to S4, has an electrode structure different from that of the remaining series arm resonators S2, S3, and S4. Accordingly, both increased steepness in the filter characteristics and a reduced insertion loss in the passband are able to be achieved. This will be described in more detail below.

Hereinafter, the elastic wave resonator having the electrode structure of the series arm resonator S1 is referred to as a first elastic wave resonator, and the elastic wave resonator having the electrode structure of the remaining series arm resonators S2 to S4 is referred to as a second elastic wave resonator.

Figure 2:
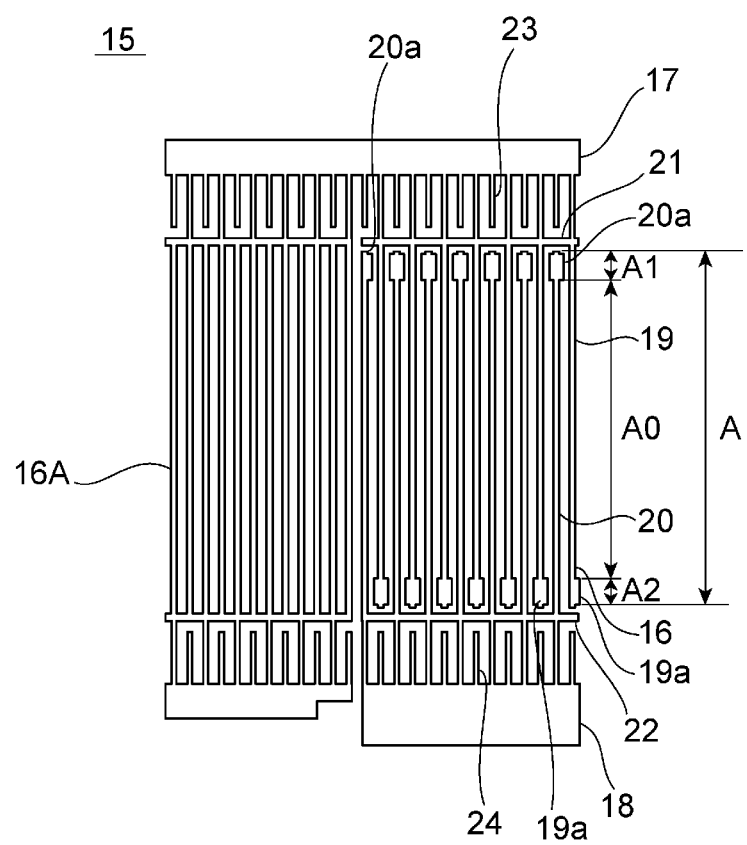
FIG. 2 is a plan view for describing an electrode structure of a first elastic wave resonator.

FIG. 2 is a plan view for describing the electrode structure of the first elastic wave resonator. In the first elastic wave resonator, the electrode structure as illustrated is provided on a piezoelectric substrate 15. FIG. 2 illustrates an IDT electrode 16 and a reflector 16A. Although not illustrated, a reflector is similarly provided on a side of the IDT electrode 16 opposite the side thereof on which the reflector 16A is provided to define a one-port elastic wave resonator.

The IDT electrode 16 includes a first busbar 17 and a second busbar 18 facing each other. To the first busbar 17, the base end of each first electrode finger 19 is connected. The leading end of each first electrode finger 19 is located on a side thereof closer to the second busbar 18. Each second electrode finger 20 includes a base end that is connected to the second busbar 18 and a leading end that is located on a side thereof closer to the first busbar 17. The plurality of first electrode fingers 19 and the plurality of second electrode fingers 20 are interposed with one another.

The first electrode fingers 19 and the second electrode fingers 20 overlap when viewed in an elastic wave propagation direction in an intersection area A. In the intersection area A, a voltage is applied between the first electrode fingers 19 and the second electrode fingers 20, and an elastic wave is excited.

In the intersection area A, a first edge area A1 is provided on one side of a central area A0 and a second edge area A2 is provided on the other side thereof to reduce or prevent a transverse-mode ripple. In the first edge area A1 and in the second edge area A2, the acoustic velocity is lower than that in the central area A0. In an outer side portion of the first edge area A1 and in an outer side portion of the second edge area A2, an area in which the acoustic velocity is higher than that in the first edge area A1 and in the second edge area A2 is provided. That is, an area between a first thin busbar 21 and the leading end of each second electrode finger 20 is the area in which the acoustic velocity is relatively high. Further, in an area between a second thin busbar 22 and the leading end of each first electrode finger 19, the acoustic velocity is higher than that in the second edge area A2. Accordingly, a transverse-mode ripple is reduced or prevented.

In the first elastic wave resonator, the plurality of first electrode fingers 19 each include a large-width portion 19a in the second edge area A2. The large-width portion 19a is a portion having a width that is larger than that of the remaining portions of the first electrode finger 19. Accordingly, the acoustic velocity in the second edge area A2 is reduced. Similarly, the second electrode fingers 20 each include a large-width portion 20a in the first edge area A1. Accordingly, the acoustic velocity in the first edge area A1 is reduced.

The width of the large-width portion 19a at the leading end of the first electrode finger 19 that is located in an end portion in the elastic wave propagation direction and that of the large-width portion 20a at the leading end of the second electrode finger 20 that is located in an end portion in the elastic wave propagation direction are smaller than the width of the large-width portions 19a of the remaining first electrode fingers 19 and that of the large-width portions 20a of the remaining second electrode fingers 20. Although the widths need not be specifically limited to these, the widths are set such that the outside edge of the first electrode finger 19 and that of the second electrode finger 20 are straight at the respective ends of the IDT electrode in the elastic wave propagation direction.

In an outer side portion of the first thin busbar 21 and in an outer side portion of the second thin busbar 22, dummy electrodes 23 and dummy electrodes 24 are further provided respectively to provide a high-acoustic-velocity area and a middle-acoustic-velocity area. The first thin busbar 21, the second thin busbar 22, the dummy electrodes 23, and the dummy electrodes 24 need not necessarily be provided.

Figure 3:
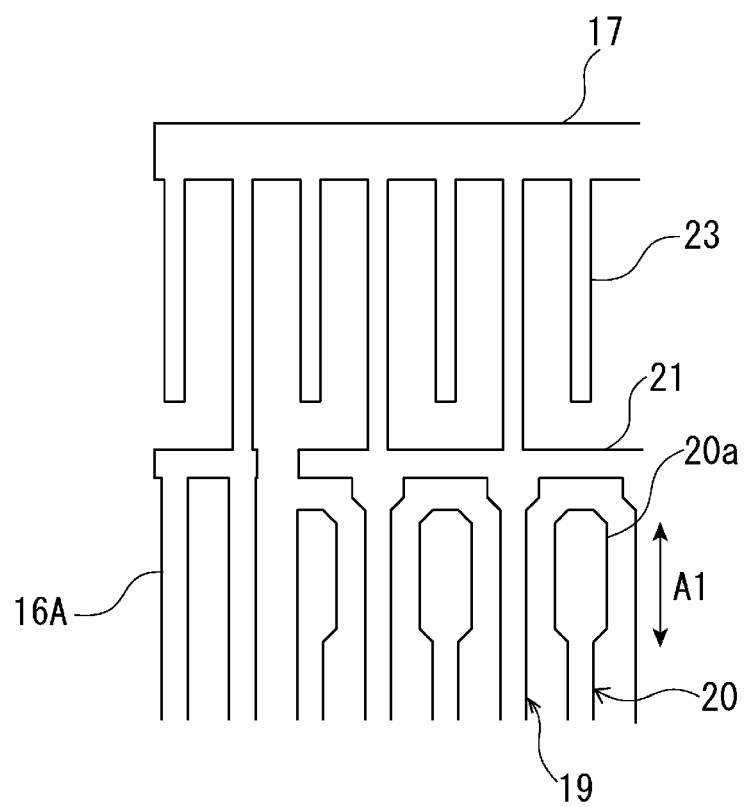
FIG. 3 is a partially cutaway plan view illustrating a portion of FIG. 2 in an enlarged manner.

As illustrated in FIG. 3, in each second electrode finger 20, the large-width portion 20a is provided at the leading end thereof, and therefore, the portion in which the large-width portion 20a is provided defines the first edge area A1. Accordingly, the acoustic velocity in the first edge area A1 is reduced.

As described above, the series arm resonator S1 is defined by the first elastic wave resonator.

Figure 4:
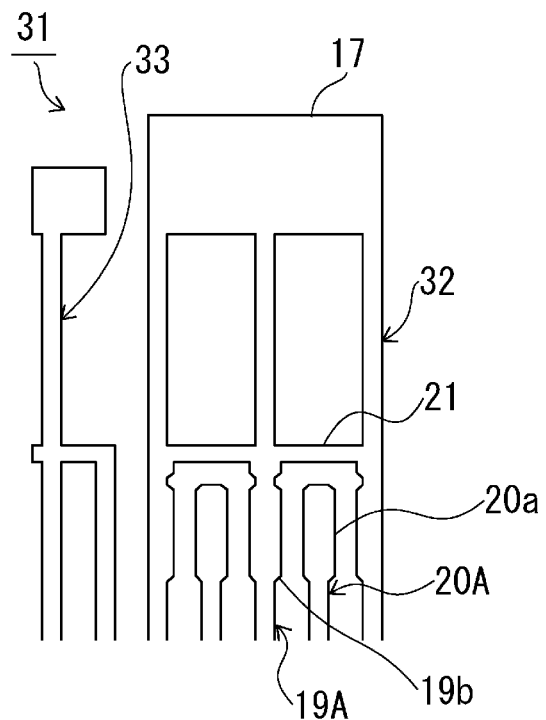
FIG. 4 is a partially cutaway plan view for describing the shapes of electrode fingers of remaining series arm resonators according to the first preferred embodiment of the present invention.

FIG. 4 is a partially cutaway plan view for describing the electrode structure of the second elastic wave resonator.

In the second elastic wave resonator 31, a reflector 33 is provided on one side of an IDT electrode 32 in the elastic wave propagation direction. Although not illustrated, a reflector is also provided on the other side thereof in the elastic wave propagation direction to define a one-port elastic wave resonator. As illustrated in FIG. 4, a plurality of first electrode fingers 19A and a plurality of second electrode fingers 20A are provided so as to be interposed with one another. The second elastic wave resonator is different from the first elastic wave resonator in that each first electrode finger 19A includes a large-width portion 19b in the first edge area. Although not illustrated in FIG. 4, each second electrode finger 20A includes a large-width portion not only at the leading end thereof but also in the second edge area. That is, in the second elastic wave resonator 31, each first electrode finger 19A includes the large-width portion in both of the first edge area and the second edge area, and each second electrode finger 20A includes the large-width portion in both of the first edge area and the second edge area. Accordingly, the acoustic velocity in the first edge area and in the second edge area is able to be more effectively reduced.

Figure 5:
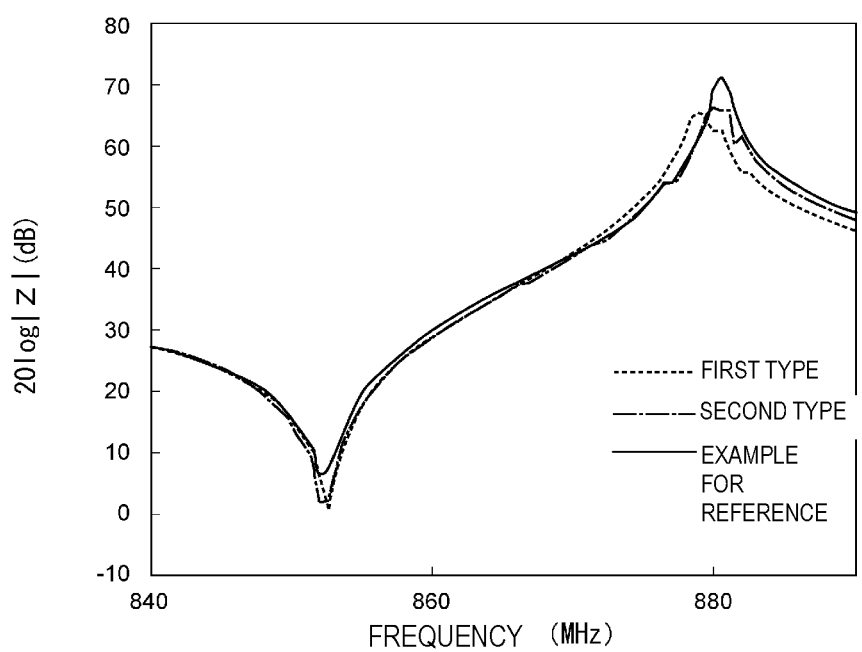
FIG. 5 is a diagram illustrating the resonance characteristics of the first elastic wave resonator, a second elastic wave resonator, and an example elastic wave resonator for reference that is subjected to apodization weighting.

FIG. 5 is a diagram illustrating the resonance characteristics of the first elastic wave resonator and the second elastic wave resonator, which are configured similarly except for the configuration of the large-width portions, and an example elastic wave resonator for reference. The example for reference is subjected to apodization weighting so that a portion outlined by the envelope is a rhombus area. The solid line represents the resonance characteristics of the example elastic wave resonator for reference. The dashed line represents the resonance characteristics of the first elastic wave resonator, and the dot-and-dash line represents the resonance characteristics of the second elastic wave resonator. With the first elastic wave resonator and the second elastic wave resonator using the piston mode described above, the bandwidth ratio that represents the frequency difference between the resonant frequency and the anti-resonant frequency is small. Further, the bandwidth ratio of the first elastic wave resonator is smaller than the bandwidth ratio of the second elastic wave resonator.

In the transmission filter 11 according to the present preferred embodiment, the series arm resonator S1 is defined by the first elastic wave resonator.

Although the Q factor of the first elastic wave resonator is lower than that of the second elastic wave resonator, the bandwidth ratio of the first elastic wave resonator is smaller than that of the second elastic wave resonator, and therefore, steepness in the filter characteristics is able to be increased. This is because the anti-resonant frequency of the series arm resonators S1 to S4 defines an attenuation pole in a high-frequency range of the transmission filter 11. At least one of the series arm resonators, that is, the series arm resonator S1, is defined by the first elastic wave resonator, and the remaining series arm resonators S2 to S4 are each defined by the second elastic wave resonator. The anti-resonant frequency of the first elastic wave resonator is in a lower-frequency range than that of the second elastic wave resonator, and therefore, steepness in a high-frequency range of the transmission filter 11, which is a ladder filter, is able to be effectively increased.

Figure 6:
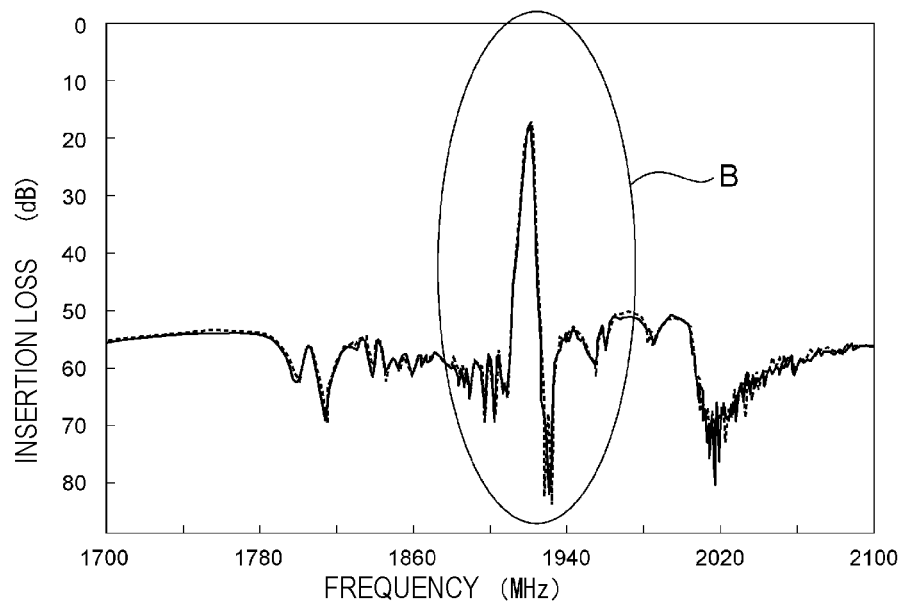
FIG. 6 is a diagram illustrating the S32 transmission characteristics of a transmission filter according to the first preferred embodiment of the present invention and a transmission filter according to a comparative example.
Figure 7:
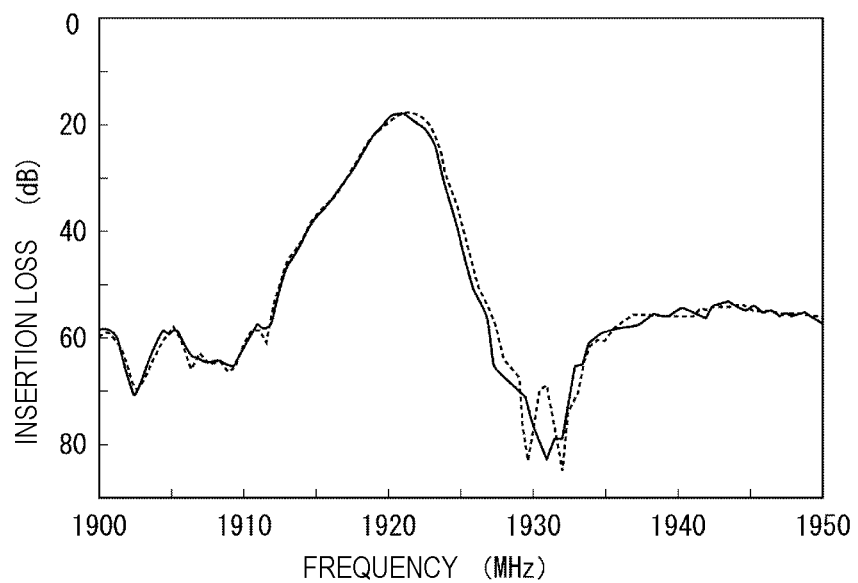
FIG. 7 is a diagram illustrating a main portion in FIG. 6 in an enlarged manner.

FIG. 6 is a diagram illustrating the S32 transmission characteristics of the transmission filter according to the first preferred embodiment and a transmission filter according to a comparative example. FIG. 7 is a diagram illustrating a portion outlined by the circular line B in FIG. 6 in an enlarged manner. Note that, for example, the passband of the transmission filter 11 preferably ranges from about 1850 Hz to about 1910 Hz.

In FIG. 6 and FIG. 7, the solid line represents the S32 transmission characteristics of the transmission filter 11 according to the first preferred embodiment, and the dashed line represents the S32 transmission characteristics of a transmission filter according to a comparative example configured similarly to the first preferred embodiment, except that every series arm resonator is defined by the second elastic wave resonator.

The frequency position in a high-frequency range in the passband of the transmission filter according to the first preferred embodiment and that of the transmission filter according to the comparative example for each attenuation, namely, about 3 dB, about 3.5 dB, about 50 dB, and about 55 dB are as indicated in Table 1 below. The steepness that is the difference between the attenuation for about 3.5 dB and the attenuation for about 50 dB, and the steepness that is the difference between the attenuation for about 3.5 dB and the attenuation for about 55 dB are also indicated in Table 1.

TABLE 1

| | Insertion Loss in Transmission Band | | Isolation in Reception Band | | Steepness | |
| --- | --- | --- | --- | --- | --- | --- |
| | 3 dB | 3.5 dB | 50 dB | 55 dB | 3.5-50 dB | 3.5-555 dB |
| Comparative Example | 1913.652 | 1915.324 | 1926.246 | 1927.104 | 10.922 | 11.78 |

TABLE 1-continued

| | Insertion Loss in Transmission Band | | Isolation in Reception Band | | Steepness | |
|---|---|---|---|---|---|---|
| | 3 dB | 3.5 dB | 50 dB | 55 dB | 3.5-50 dB | 3.5-555 dB |
| First Preferred Embodiment | 1913.686 | 1915.433 | 1925.891 | 1926.728 | 10.458 | 11.295 |
| Improvement | | | | | 0.464 | 0.485 |

As is clear from Table 1, according to the first preferred embodiment, steepness in the filter characteristics in a high-frequency range in the passband is able to be effectively increased compared to the comparative example. As is clear from FIG. 6 and FIG. 7, it was discovered that not only is steepness in the filter characteristics increased but also the insertion loss in the passband is reduced.

Note that, in the first preferred embodiment, the series arm resonator S1 is defined by the first elastic wave resonator, and the remaining series arm resonators S2 to S4 are each defined by the second elastic wave resonator. However, the resonators are not limited to these, and at least one of the series arm resonators needs to be the first elastic wave resonator, and at least one of the remaining series arm resonators and the parallel arm resonators need to be the second elastic wave resonators. When the first elastic wave resonator is used in an elastic wave filter device, steepness in the filter characteristics is able to be increased and the insertion loss is able to be reduced.

Figure 8:
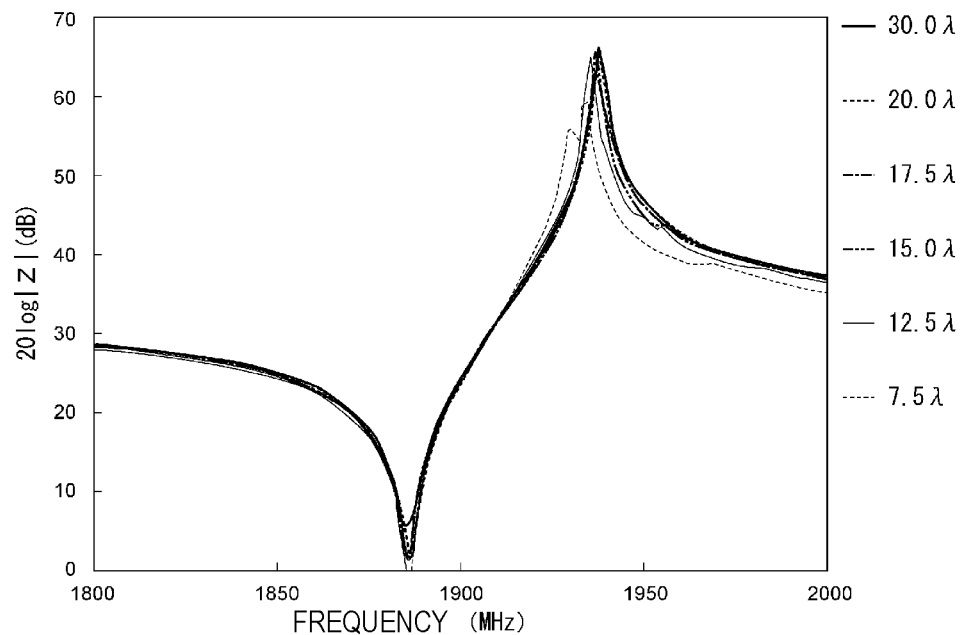
FIG. 8 is a diagram illustrating changes in the resonance characteristics in a case in which the electrostatic capacitance is fixed and the intersecting width is changed in the first elastic wave resonator.

FIG. 8 is a diagram illustrating the resonance characteristics in a case in which the electrostatic capacitance is fixed and the intersecting width is changed to about 30.0λ, about 20.0λ, about 17.5λ, about 15.0λ, about 12.5λ, or about 7.5λ in the first elastic wave resonator.

Here, λ is a wavelength determined based on the electrode finger pitch of the IDT electrode.

Table 2 below indicates relationships between the bandwidth ratio and a value Apt1/Apt2 in a case in which the intersecting width is changed as described above.

TABLE 2

| | Intersecting Width | | | | | |
|---|---|---|---|---|---|---|
| | 30.0 λ | 20.0 λ | 17.5 λ | 15.0 λ | 12.5 λ | 7.5 λ |
| Bandwidth Ratio of the first-type | 52.5 | 52.5 | 50.83 | 51.633 | 50 | 48.3 |
| elastic wave resonator Apt1/Apt2 | 0.04298 | 0.0549 | 0.0638 | 0.0759 | 0.094047 | 0.1792 |

In Table 2, Apt1 is the length of the first edge area A1 and the second edge area A2 in a direction in which the first and second electrode fingers extend, and Apt2 is the length of the central area A0 in the direction in which the first and second electrode fingers extend.

As is clear from Table 2, in a case in which the capacitance is fixed and the intersecting width is changed, the bandwidth ratio for the intersecting width of about 17.5λ or less is smaller than the bandwidth ratio for the intersecting width of about 20λ or more. As is clear from FIG. 8, a transverse-mode ripple appears between the resonant frequency and the anti-resonant frequency if the intersecting width is about 7.5λ, and a slight transverse-mode ripple appears if the intersecting width is about 12.5λ. Therefore, it is preferable to set Apt1/Apt2 to about 0.0638 or more and about 0.094047 or less, for example. Accordingly, a transverse-mode ripple is able to be reduced or prevented and the bandwidth ratio is able to be sufficiently reduced. More preferably, Apt1/Apt2 is to be about 0.0759 or less, for example. In this case, a transverse-mode ripple is able to be more effectively reduced or prevented.

Figure 9:
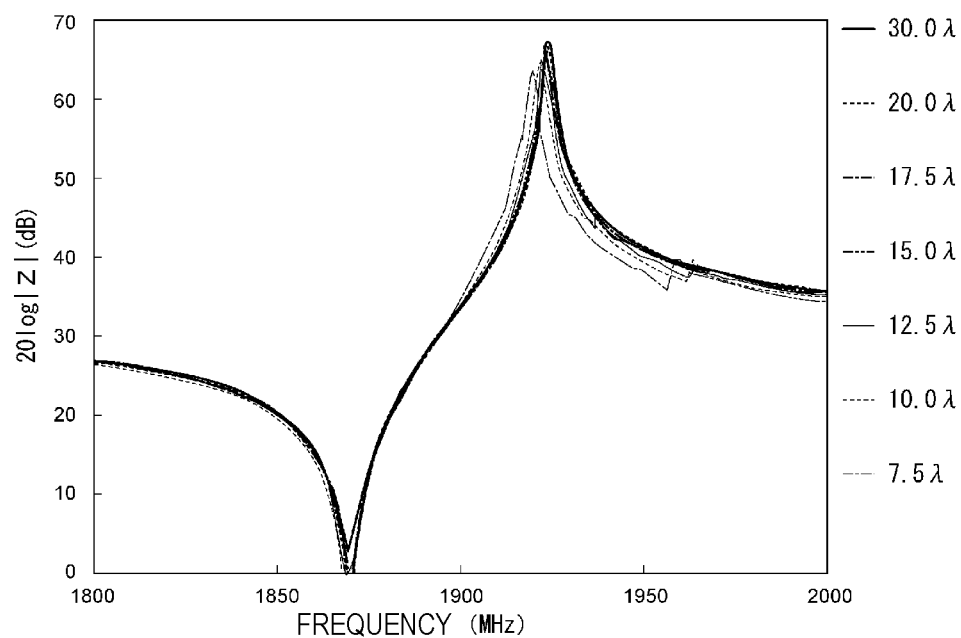
FIG. 9 is a diagram illustrating changes in the resonance characteristics in a case in which the electrostatic capacitance is fixed and the intersecting width is changed in the second elastic wave resonator.
Figure 10:
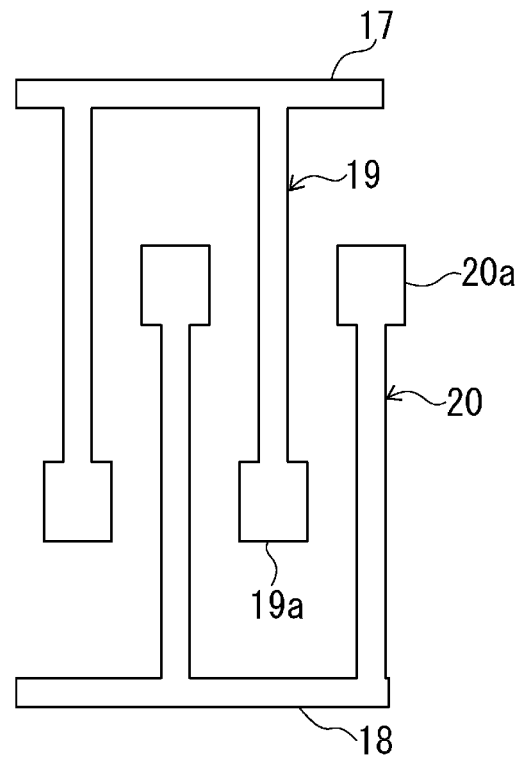
FIG. 10 is a plan view illustrating the electrode structure of the first elastic wave resonator according to a first modification of a preferred embodiment of the present invention.

FIG. 9 is a diagram illustrating changes in the resonance characteristics in a case in which the electrostatic capacitance is fixed and the intersecting width is changed to about 30.0λ, about 20.0λ, about 17.5λ, about 15.0λ, about 12.5λ, about 10.0λ, or about 7.5λ in the second elastic wave resonator.

Relationships between the magnitude of the bandwidth ratio and Apt3/Apt4 in a case in which the intersecting width is changed as described above are indicated in Table 3 below.

TABLE 3

| | Intersecting Width | | | | | | |
|---|---|---|---|---|---|---|---|
| | 30.0 λ | 20.0 λ | 17.5 λ | 15.0 λ | 12.5 λ | 10.0 λ | 7.5 λ |
| Bandwidth Ratio of the second-type elastic wave resonator | 52.5 | 52.5 | 52.5 | 52.5 | 50.883 | 50.000 | 49.166 |
| Apt3/Apt4 | 0.03167 | 0.04907 | 0.05687 | 0.06764 | 0.083423 | 0.10881 | 0.15644 |

In Table 3, Apt3 is the length of the first edge area A1 and the second edge area A2 in a direction in which the first and second electrode fingers extend, and Apt4 is the length of the central area A0 in the direction in which the first and second electrode fingers extend.

As is clear from Table 3, in the second elastic wave resonator, it was discovered that a transverse-mode ripple is able to be effectively reduced or prevented if the intersecting width is about 10λ or more. Therefore, it is preferable to set Apt3/Apt4 to about 0.10881 or less, for example. If Apt3/Apt4 is 0.083423 or more, the bandwidth ratio is able to be reduced. Therefore, it is preferable to set Apt3/Apt4 to about 0.083423 or more and about 0.10881 or less, for example.

The electrode structure in the first elastic wave resonator is not limited to that illustrated in FIG. 2 and may be modified to first to tenth modifications of a preferred embodiment of the present invention respectively illustrated in FIG. 10 to FIG. 19 described below. In the first modification illustrated in FIG. 10, the first thin busbar 21, the second thin busbar 22, and the dummy electrodes 23 and 24 described above are not provided. Thus, the first thin busbar 21 and the second thin busbar 22 need not necessarily be provided.

Figure 11:
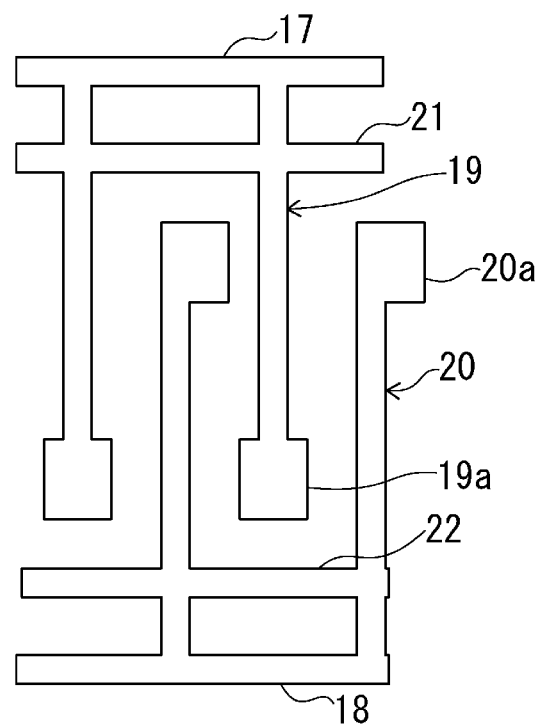
FIG. 11 is a plan view illustrating the electrode structure of the first elastic wave resonator according to a second modification of a preferred embodiment of the present invention.

In the second modification illustrated in FIG. 11, the large-width portion 20a of each second electrode finger 20 in the first edge area A1 is off-center in the second electrode finger 20 in the elastic wave propagation direction. Thus, the center of the large-width portion of each second electrode finger may be shifted from the center of the remaining portion thereof in the elastic wave propagation direction.

Figure 12:
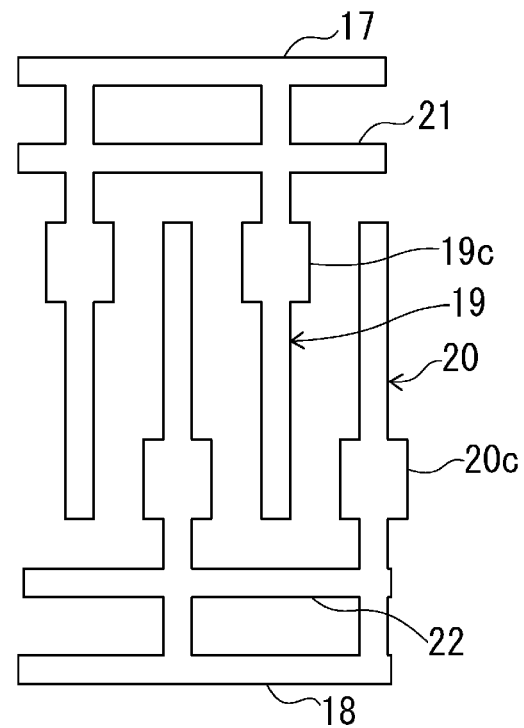
FIG. 12 is a plan view illustrating the electrode structure of the first elastic wave resonator according to a third modification of a preferred embodiment of the present invention.

In the third modification illustrated in FIG. 12, a large-width portion 19c is provided in each first electrode finger 19 in a portion that overlaps the leading ends of the second electrode fingers 20 in the elastic wave propagation direction, and a large-width portion 20c is provided in each second electrode finger 20 in an area that overlaps the leading ends of the first electrode fingers 19. That is, each first electrode finger 19 includes the large-width portion 19c in the first edge area A1, and each second electrode finger 20 includes the large-width portion 20c in the second edge area A2.

Figure 13:
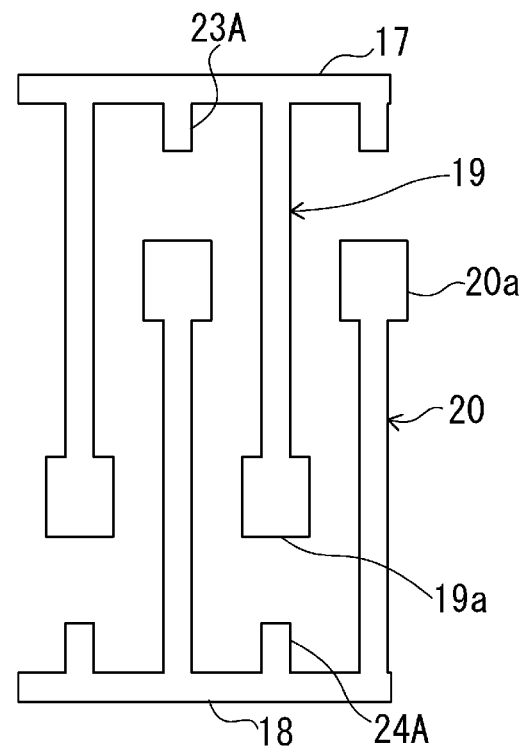
FIG. 13 is a plan view illustrating the electrode structure of the first elastic wave resonator according to a fourth modification of a preferred embodiment of the present invention.

In the fourth modification illustrated in FIG. 13, each dummy electrode 23A is provided so as to face the leading end of a corresponding one of the second electrode fingers 20, and each dummy electrode 24A is provided so as to face the leading end of a corresponding one of the first electrode fingers 19.

Figure 14:
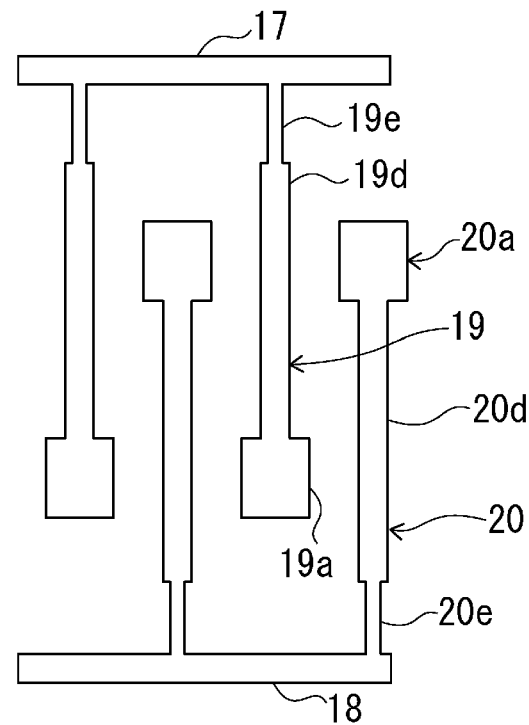
FIG. 14 is a plan view illustrating the electrode structure of the first elastic wave resonator according to a fifth modification of a preferred embodiment of the present invention.

In the fifth modification illustrated in FIG. 14, a portion of each first electrode finger other than the large-width portion 19a includes two portions having different widths, and a portion of each second electrode finger other than the large-width portion 20a includes two portions having different widths. That is, portions 19d and 20d, which are narrower than the large-width portions 19a and 20a, and portions 19e and 20e, which are even narrower than the large-width portions 19a and 20a, are provided.

Figure 15:
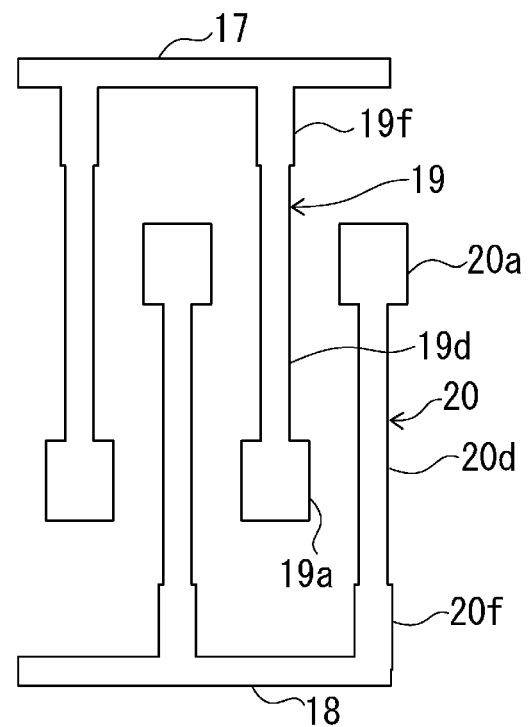
FIG. 15 is a plan view illustrating the electrode structure of the first elastic wave resonator according to a sixth modification of a preferred embodiment of the present invention.

In the sixth modification illustrated in FIG. 15, the portions 19d and 20d, which are narrower than the large-width portions 19a and 20a, and portions 19f and 20f, which are narrower than the large-width portions 19a and 20a and wider than the narrow portions 19d and 20d, are provided.

Figure 16:
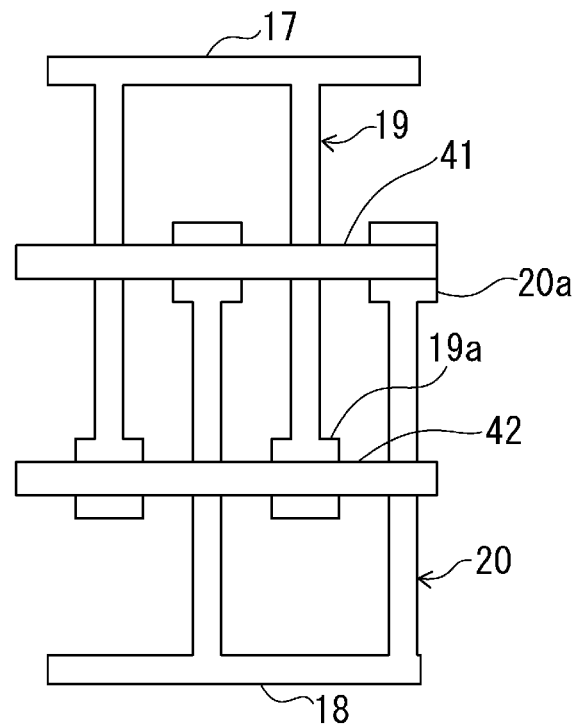
FIG. 16 is a plan view illustrating the electrode structure of the first elastic wave resonator according to a seventh modification of a preferred embodiment of the present invention.

In the seventh modification illustrated in FIG. 16, dielectric layers 41 and 42 are provided. The dielectric layer 41 extends in the elastic wave propagation direction so as to overlap over the large-width portions 20a in the first edge area A1. The dielectric layer 42 extends in the elastic wave propagation direction so as to overlap the large-width portions 19a in the second edge area A2. As these dielectrics, various dielectrics, such as $SiO_2$, for example, may preferably be used.

Figure 17:
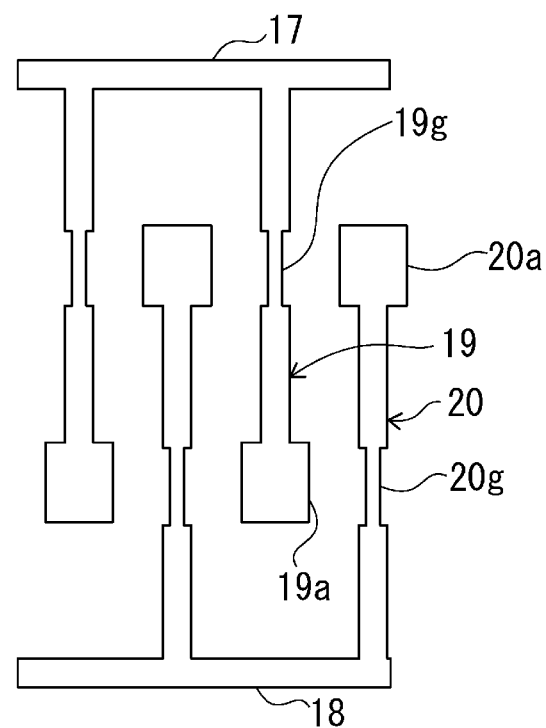
FIG. 17 is a plan view illustrating the electrode structure of the first elastic wave resonator according to an eighth modification of a preferred embodiment of the present invention.

In the eighth modification illustrated in FIG. 17, in each first electrode finger 19, a small-width portion 19g having a width relatively smaller than the widths of the remaining electrode finger portion is provided in the first edge area A1, and in each second electrode finger 20, a small-width portion 20g having a width relatively smaller than the widths of the remaining electrode finger portion is provided in the second edge area A2. Also in this case, the acoustic velocity in the second edge area A2 needs to be lower than that in the central area with the large-width portions 19a and the small-width portions 20g, and the acoustic velocity in the first edge area A1 needs to be lower than that in the central area with the large-width portions 20a and the small-width portions 19g.

Figure 18:
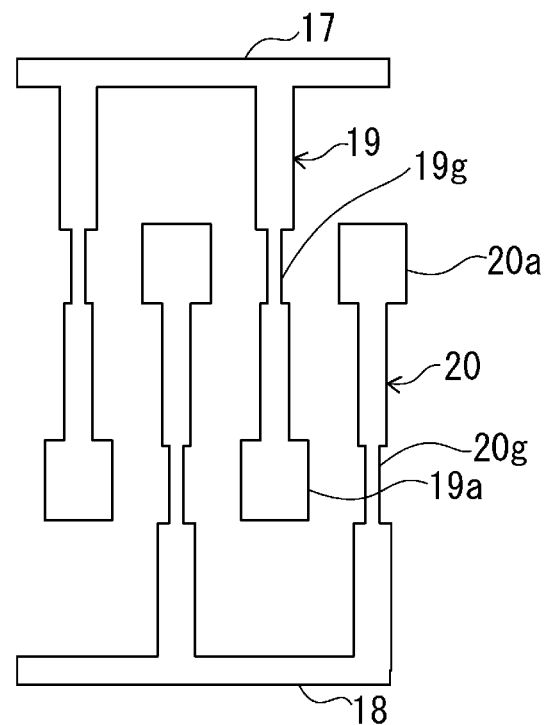
FIG. 18 is a plan view illustrating the electrode structure of the first elastic wave resonator according to a ninth modification of a preferred embodiment of the present invention.

In the ninth modification illustrated in FIG. 18, in addition to the structure according to the modification illustrated in FIG. 17, the width of each first electrode finger 19 is increased in a high-acoustic-velocity area that is an outer side portion of the first edge area A1, and the width of each second electrode finger 20 is increased in a high-acoustic-velocity area that is an outer side portion of the second edge area A2. Thus, the width of each first electrode finger 19 in the outer high-acoustic-velocity area and the width of each second electrode finger 20 in the outer high-acoustic-velocity area may be slightly increased as long as the acoustic velocity in the outer high-acoustic-velocity areas is higher than the acoustic velocity in the first edge area A1 and in the second edge area A2, which are low-acoustic-velocity areas.

Figure 19:
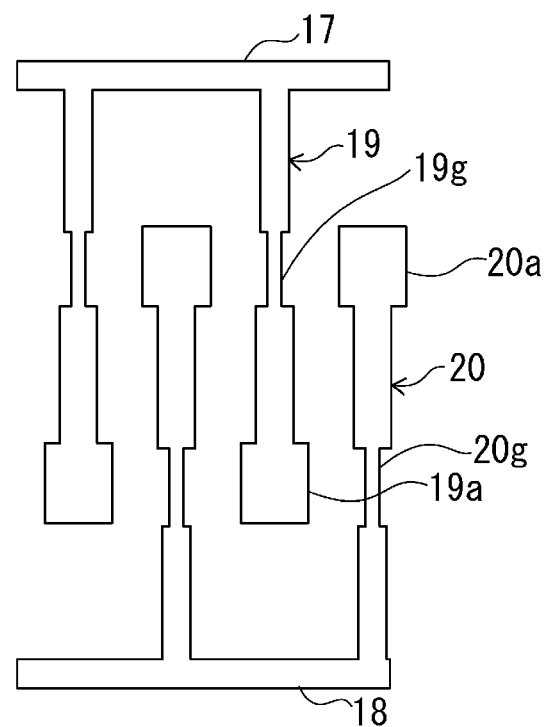
FIG. 19 is a plan view illustrating the electrode structure of the first elastic wave resonator according to a tenth modification of a preferred embodiment of the present invention.

As in the tenth modification illustrated in FIG. 19, the width of each first electrode finger 19 in the central area A0 may be larger than the width of the first electrode finger 19 in the first edge area A1 and that in the outer high-acoustic-velocity area, and the width of each second electrode finger 20 in the central area A0 may be larger than the width of the second electrode finger 20 in the second edge area A2 and that in the outer high-acoustic-velocity area.

As illustrated in FIG. 10 to FIG. 19, in the first elastic wave resonator, the electrode shapes of the large-width portions and the electrode shapes of the other portions having different widths may be modified as appropriate. The same applies to the second elastic wave resonator.

Figure 20:
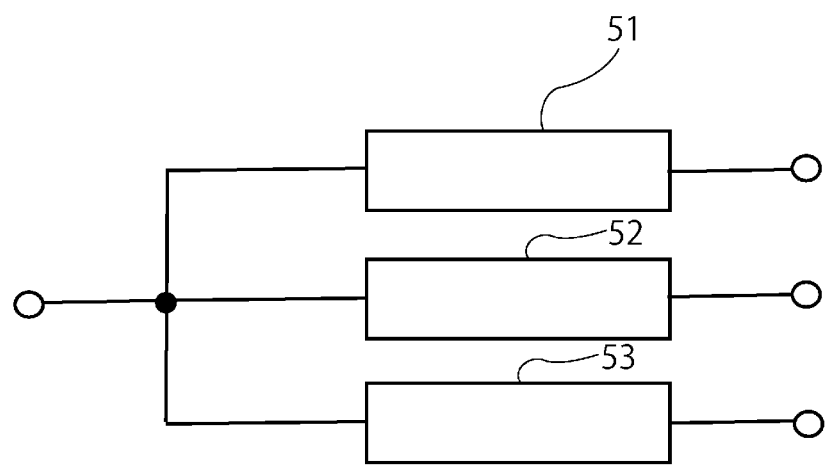
FIG. 20 is a circuit diagram of a bundled elastic wave filter device in which a plurality of bandpass filters are bundled at one end thereof.

Further, as illustrated in FIG. 20, the present invention is applicable to an elastic wave filter device in which a plurality of bandpass filters 51 to 53 are bundled at one end thereof. Also in a duplexer and the bundled elastic wave filter device described above, preferably, a ladder filter configured according to a preferred embodiment of the present invention is used to define a bandpass filter having a first passband that is a relatively low passband. In this case, steepness in the filter characteristics in a high-frequency range of the first passband of the first bandpass filter is able to be effectively increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave filter device comprising:
 a ladder filter that includes series arm resonators and parallel arm resonators each defined by elastic wave resonators; wherein each of the elastic wave resonators includes a piezoelectric body, a first busbar and a second busbar facing each other, a plurality of first electrode fingers each including a base end connected to the first busbar and a leading end located on a side thereof closer to the second busbar, and a plurality of second electrode fingers each including a base end connected to the second busbar and a leading end located on a side thereof closer to the first busbar;

the first busbar, the second busbar, the plurality of first electrode fingers, and the plurality of second electrode fingers are provided on the piezoelectric body;

the plurality of first electrode fingers and the plurality of second electrode fingers being interposed with one another;

the plurality of first electrode fingers and the plurality of second electrode fingers overlap in an elastic wave propagation direction in an intersection area;

the intersection area includes a central area located centrally in a direction in which the plurality of first electrode fingers and the plurality of second electrode fingers extend, a first edge area located on a side of the central area closer to the first busbar, and a second edge area located on a side of the central area closer to the second busbar, such that an acoustic velocity in the first edge area and in the second edge area is lower than an acoustic velocity in the central area;

in at least one series arm resonator among the series arm resonators, each of the first electrode fingers includes a large-width portion having a width larger than a width of a remaining portion in the second edge area, and each of the second electrode fingers includes a large-width portion having a width larger than a width of a remaining portion in the first edge area; and in at least one of remaining series arm resonators and the parallel arm resonators, each of the first electrode fingers includes a large-width portion having a width larger than a width of a remaining portion in both of the first edge area and the second edge area, and each of the second electrode fingers includes a large-width portion having a width larger than a width of a remaining portion in both of the first edge area and the second edge area.

2. The elastic wave filter device according to claim 1, wherein, in the at least one series arm resonator, when a length of the first edge area and the second edge area in the direction in which the first electrode fingers and the second electrode fingers extend is represented by Apt1, and a length of the central area in the direction in which the first electrode fingers and the second electrode fingers extend is represented by Apt2, Apt1/Apt2 is about 0.0638 or more and about 0.094047 or less.

3. The elastic wave filter device according to claim 1, wherein the at least one series arm resonator is a series arm resonator having a largest electrode finger pitch among the series arm resonators.

4. The elastic wave filter device according to claim 1, wherein the at least one series arm resonator is a series arm resonator having a lowest anti-resonant frequency among the series arm resonators.

5. The elastic wave filter device according to claim 1, wherein the series arm resonators and the parallel arm resonators are provided on a single piezoelectric substrate.

6. The elastic wave filter device according to claim 1, wherein, when the ladder filter is a first bandpass filter having a first passband, the elastic wave filter device further includes a second bandpass filter having a second passband in a higher-frequency range than the first passband, the second bandpass filter and the first bandpass filter being commonly connected at one end thereof.

7. The elastic wave filter device according to claim 6, wherein the first bandpass filter is a transmission filter and the second bandpass filter is a reception filter to form a duplexer.

8. The elastic wave filter device according to claim 2, wherein, Apt1/Apt2 is about 0.0638 or more and about 0.0759 or less.

9. The elastic wave filter device according to claim 1, wherein the large-width portion of each of the second electrode fingers is off-center in the second electrode finger in the elastic wave propagation direction.

10. An elastic wave filter device comprising:

a ladder filter that includes series arm resonators and parallel arm resonators defined by elastic wave resonators; wherein each of the elastic wave resonators includes a piezoelectric body, a first busbar and a second busbar facing each other, a plurality of first electrode fingers each including a base end connected to the first busbar and a leading end located on a side thereof closer to the second busbar, and a plurality of second electrode fingers each including a base end connected to the second busbar and a leading end located on a side thereof closer to the first busbar;

the first busbar, the second busbar, the plurality of first electrode fingers, and the plurality of second electrode fingers are provided on the piezoelectric body;

the plurality of first electrode fingers and the plurality of second electrode fingers are interposed with one another;

the plurality of first electrode fingers and the plurality of second electrode fingers overlap in an elastic wave propagation direction in an intersection area;

the intersection area includes a central area located centrally in a direction in which the first electrode fingers and the second electrode fingers extend, a first edge area located on a side of the central area closer to the first busbar, and a second edge area located on a side of the central area closer to the second busbar, such that an acoustic velocity in the first edge area and in the second edge area is lower than an acoustic velocity in the central area;

in at least one series arm resonator among the series arm resonators, and in at least one of the series arm resonators other than the at least one series arm resonator and the parallel arm resonators, each of the first electrode fingers includes a large-width portion having a width larger than a width of a remaining portion in both of the first edge area and the second edge area, and each of the second electrode fingers includes a large-width portion having a width larger than a width of a remaining portion in both of the first edge area and the second edge area; and in the at least one series arm resonator, when a length of the first edge area and the second edge area in the direction in which the first electrode fingers and the second electrode fingers extend is represented by Apt3, and a length of the central area in the direction in which the first electrode fingers and the second electrode fingers extend is represented by Apt4, Apt3/Apt4 is about 0.083423 or more and about 0.10881 or less.

11. The elastic wave filter device according to claim 10, wherein the at least one series arm resonator is a series arm resonator having a largest electrode finger pitch among the series arm resonators.

12. The elastic wave filter device according to claim 10, wherein the at least one series arm resonator is a series arm resonator having a lowest anti-resonant frequency among the series arm resonators.

13. The elastic wave filter device according to claim 10, wherein the series arm resonators and the parallel arm resonators are provided on a single piezoelectric substrate.

14. The elastic wave filter device according to claim 10, wherein, when the ladder filter is a first bandpass filter having a first passband, the elastic wave filter device further includes a second bandpass filter having a second passband in a higher-frequency range than the first passband, the second bandpass filter and the first bandpass filter being commonly connected at one end thereof.

15. The elastic wave filter device according to claim 14, wherein the first bandpass filter is a transmission filter and the second bandpass filter is a reception filter to define a duplexer.

16. The elastic wave filter device according to claim 14, wherein the large-width portion of each of the second electrode fingers is off-center in the second electrode finger in the elastic wave propagation direction.

* * * * *